(12) United States Patent  
Xin (10) Patent No.: US 7,206,992 B2
(45) Date of Patent: Apr. 17, 2007

(54) DECODING A RECEIVED BCH ENCODED SIGNAL

(75) Inventor: Weizhuang (Wayne) Xin, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 427 days.

(21) Appl. No.: 10/704,834

(22) Filed: Nov. 10, 2003

(65) Prior Publication Data

US 2004/0181735 A1  Sep. 16, 2004

(51) Int. Cl.
   *H03M 13/00* (2006.01)
(52) U.S. Cl. .................. 714/782; 714/704; 714/785
(58) Field of Classification Search ............. 714/781, 714/782, 785
   See application file for complete search history.

(56) References Cited

U.S. PATENT DOCUMENTS

| | | | | |
|---|---|---|---|---|
| 4,866,716 A * | 9/1989 | Weng | ............. | 714/782 |
| 5,297,153 A * | 3/1994 | Baggen et al. | ............. | 714/782 |
| 6,192,497 B1 * | 2/2001 | Yang et al. | ............. | 714/781 |
| 6,374,383 B1 * | 4/2002 | Weng | ............. | 714/781 |
| 6,560,747 B1 * | 5/2003 | Weng | ............. | 714/781 |
| 6,637,002 B1 * | 10/2003 | Weng et al. | ............. | 714/781 |
| 6,639,865 B2 * | 10/2003 | Kwon | ............. | 365/230.03 |
| 6,704,902 B1 * | 3/2004 | Shinbashi et al. | ............. | 714/785 |
| 6,792,569 B2 * | 9/2004 | Cox et al. | ............. | 714/781 |
| 7,010,739 B1 * | 3/2006 | Feng et al. | ............. | 714/784 |

* cited by examiner

*Primary Examiner*—Albert Decady
*Assistant Examiner*—Esaw Abraham
(74) *Attorney, Agent, or Firm*—Garlick Harrison & Markison; Timothy W. Markison; Kevin L. Smith (57) ABSTRACT

A method or apparatus for decoding of a BCH encoded signal begins by determining whether the received BCH encoded signal includes error. The decoding process continues when the received BCH encoded signal includes error by determining whether the error is correctable. This may be done by determining a number of errors of the received BCH encoded signal, identifying bit locations of the received BCH encoded signal having the error; counting the number of bit locations of the received BCH encoded signal having the error, comparing the number of errors to the number of bit locations of the received BCH encoded signal having the error, when the number of bit locations of the received BCH encoded signal having the error equals the number of errors, ceasing the identifying of the bit locations of the received BCH encoded signal having the error, and correcting information contained in the bit locations of the received BCH encoded signal having the error when the identifying of the bit locations is ceased.

26 Claims, 10 Drawing Sheets

FIG. 1
*prior art*

| 000 0000 | 001 0000 | 010 0000 | 011 0000 | 100 0000 | 101 0000 | 110 0000 | 111 0000 |
|---|---|---|---|---|---|---|---|
| 000 0001 | 001 0001 | 010 0001 | 011 0001 | 100 0001 | 101 0001 | 110 0001 | 111 0001 |
| 000 0010 | 001 0010 | 010 0010 | 011 0010 | 100 0010 | 101 0010 | 110 0010 | 111 0010 |
| 000 0011 | 001 0011 | 010 0011 | 011 0011 | 100 0011 | 101 0011 | 110 0011 | 111 0011 |
| 000 0100 | 001 0100 | 010 0100 | 011 0100 | 100 0100 | 101 0100 | 110 0100 | 111 0100 |
| 000 0101 | 001 0101 | 010 0101 | 011 0101 | 100 0101 | 101 0101 | 110 0101 | 111 0101 |
| 000 0110 | 001 0110 | 010 0110 | 011 0110 | 100 0110 | 101 0110 | 110 0110 | 111 0110 |
| 000 0111 | 001 0111 | 010 0111 | 011 0111 | 100 0111 | 101 0111 | 110 0111 | 111 0111 |
| 000 1000 | 001 1000 | 010 1000 | 011 1000 | 100 1000 | 101 1000 | 110 1000 | 111 1000 |
| 000 1001 | 001 1001 | 010 1001 | 011 1001 | 100 1001 | 101 1001 | 110 1001 | 111 1001 |
| 000 1010 | 001 1010 | 010 1010 | 011 1010 | 100 1010 | 101 1010 | 110 1010 | 111 1010 |
| 000 1011 | 001 1011 | 010 1011 | 011 1011 | 100 1011 | 101 1011 | 110 1011 | 111 1011 |
| 000 1100 | 001 1100 | 010 1100 | 011 1100 | 100 1100 | 101 1100 | 110 1100 | 111 1100 |
| 000 1101 | 001 1101 | 010 1101 | 011 1101 | 100 1101 | 101 1101 | 110 1101 | 111 1101 |
| 000 1110 | 001 1110 | 010 1110 | 011 1110 | 100 1110 | 101 1110 | 110 1110 | 111 1110 |
| 000 1111 | 001 1111 | 010 1111 | 011 1111 | 100 1111 | 101 1111 | 110 1111 | 111 1111 |

FIG. 2
prior art 16 codewords of a (7,4)
code block

| 000 0000 | 100 0110 |
| 000 1101 | 100 1011 |
| 001 0111 | 101 0001 |
| 001 1010 | 101 1100 |
| 010 0011 | 110 0101 |
| 010 1110 | 110 1000 |
| 011 0100 | 111 0010 |
| 011 1001 | 111 1111 |

| correctable error vectors | valid codewords | | | | | | |
|---|---|---|---|---|---|---|---|
| 000 0000 | 000 1101 | 001 0111 | 001 1010 | 010 0011 | 010 1110 | 011 0100 | 011 1001 |
| 000 0001 | 000 1100 | 001 0110 | 001 1011 | 010 0010 | 010 1111 | 011 0101 | 011 1000 |
| 000 0010 | 000 1111 | 001 0101 | 001 1000 | 010 0001 | 010 1100 | 011 0110 | 011 1011 |
| 000 0100 | 000 1001 | 001 0011 | 001 1110 | 010 0111 | 010 1010 | 011 0000 | 011 1101 |
| 000 1000 | 000 0101 | 001 1111 | 001 0010 | 010 1011 | 010 0110 | 011 1100 | 011 0001 |
| 001 0000 | 001 1101 | 000 0111 | 000 1010 | 011 0011 | 011 1110 | 010 0100 | 010 1001 |
| 010 0000 | 010 1101 | 011 0111 | 011 1010 | 000 0011 | 000 1110 | 001 0100 | 001 1001 |
| 100 0000 | 100 1101 | 101 0111 | 101 1010 | 110 0011 | 110 1110 | 111 0100 | 111 1001 |

| correctable error vectors | valid codewords | | | | | | |
|---|---|---|---|---|---|---|---|
| 100 0110 | 100 1011 | 101 0001 | 101 1100 | 110 0101 | 110 1000 | 111 0010 | 111 1111 |
| 100 0111 | 100 1010 | 101 0000 | 101 1101 | 110 0100 | 110 1001 | 111 0011 | 111 1110 |
| 100 0100 | 100 1001 | 101 0011 | 101 1110 | 110 0111 | 110 1010 | 111 0000 | 111 1101 |
| 100 0010 | 100 1111 | 101 0101 | 101 1000 | 110 0001 | 110 1100 | 111 0110 | 111 1011 |
| 100 1110 | 100 0011 | 101 1001 | 101 0100 | 110 1101 | 110 0000 | 111 1010 | 110 0111 |
| 101 0110 | 101 1011 | 100 0001 | 100 1100 | 111 0101 | 111 1000 | 110 0010 | 110 1111 |
| 110 0110 | 110 1011 | 111 0001 | 111 1100 | 100 0101 | 100 1000 | 101 0010 | 101 1111 |
| 000 0110 | 000 1011 | 001 0001 | 001 1100 | 010 0101 | 010 1000 | 011 0010 | 011 1111 |

$u(x) = u_0 + u_1x + u_2x^2 + \ldots u_{k-1}x^{k-1}$

$v(X) = $ remainder of $[u(X)*x^{n-k}/g(X)] + u(X)*x^{n-k}$
$v(X) = v_0 + v_1X + v_2X^2 + \ldots + v_{n-1}X^{n-1}$

FIG. 5
prior art BCH block encoding

$n = 7$ and $k = 4$
for $u = 1011$    $u(X) = 1 + x^2 + x^3$
$g(x) = 1 + x + x^3$
$u(x)*x^{n-k} = (1 + x^2 + x^3)*x^3 =$
$x^3 + x^5 + x^6$
remainder of $(x^3 + x^5 + x^6)/(1 + x + x^3)$
$= 1$, therefore
$v(x) = 1 + x^3 + x^5 + x^6$ (i.e., $v = 100\ 1011$)

$n = 7$ and $k = 4$
for $u = 0011$    $u(x) = 0\ x^2 + x^3$
$g(x) = 1 + x + x^3$
$u(x)*x^{n-k} = (x^2 + x^3)*x^3 =$
$x^5 + x^6$
remainder of $(x^5 + x^6)/(1 + x + x^3)$
$= x$, therefore
$v(x) = x + x^5 + x^6$ (i.e., $v = 010\ 0011$)

FIG. 6
prior art examples of (7,4) BCH
block encoding

FIG. 7
prior art BCH decoding

FIG. 8
prior art syndrome
calculation module

FIG. 9
prior art Chien search module

FIG. 10
BCH decoder 10

FIG. 11
BCH decoder 40

DECODING A RECEIVED BCH ENCODED SIGNAL

BACKGROUND OF THE INVENTION

1. Technical Field

This invention relates generally to data communications and more particularly to encoding and decoding of data within such communication systems.

2. Description of Related Art

As is known, communication systems include a plurality of communication devices (e.g., modems, personal computers, laptops, cell phones, radios telephones, facsimile machines, et cetera) that communicate directly (i.e., point to point) or indirectly via communication system infrastructure (e.g., wire line channels, wireless channels, bridges, switches, routers, gateways, servers, et cetera). As is also known, a communication system may include one or more local area networks and/or one or more wide area networks to support at least one of the Internet, cable services (e.g., modem functionality and television), wireless communication systems (e.g., radio, cellular telephone), satellite services, wire line telephone services, et cetera.

In any type of communication system, information (e.g., voice, audio, video, text, data, et cetera) is transmitted from one communication device to another via the infrastructure. Accordingly, the transmitting communication device prepares the information for transmission to the other device and provides the prepared information to the infrastructure for direct or indirect routing to the receiving communication device. For indirect routing, a piece of infrastructure equipment (e.g., server, router, et cetera) receives the prepared information and forwards it to another piece of infrastructure equipment or to the receiving communication device. The prepared information is thus propagated through the infrastructure until it reaches the receiving communication device. Once received, the receiving communication devices traverses the processing steps used by the transmitting communication device to prepare the information for transmission to recapture the original information.

As is further known, transmission of information between communication devices is not performed in an ideal environment where the received information exactly matches the transmitted information. In practice, the infrastructure introduces error which distorts the transmitted information such that the received information does not exactly match the transmitted information. To compensate for the error introduced by the infrastructure, the transmitting communication device often includes an error correcting code encoder and the receiving communication device includes a corresponding error correcting code decoder.

As is known, there are two general types of coding in common use: block coding and convolution coding. In general, a block coding encoder divides information sequences into message blocks and converts each message block into a code word independently. A convolutional encoder encodes message blocks into a corresponding code word but does so based on previous, in time, message blocks.

Figure 1:
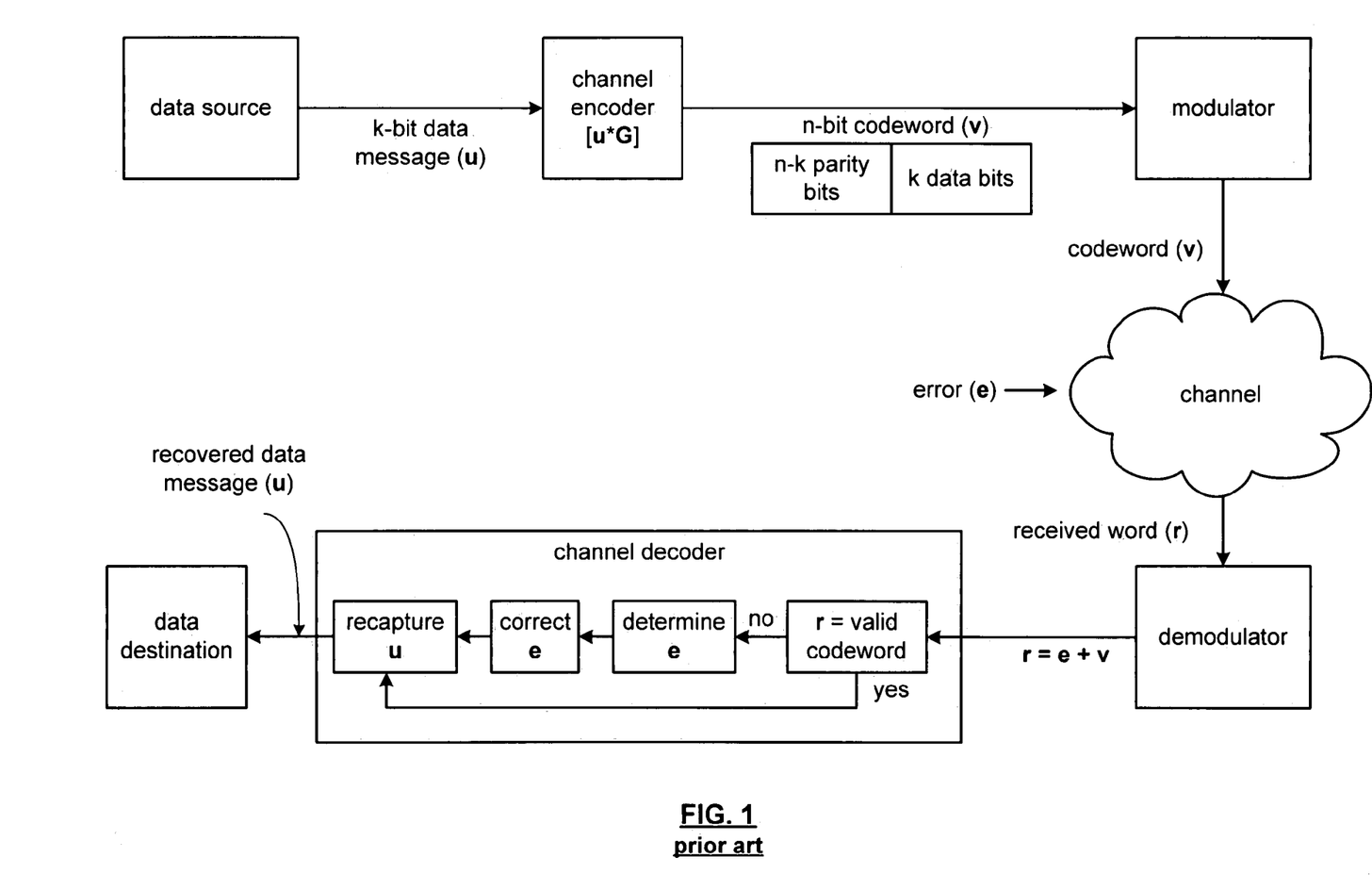
FIG. 1 is a schematic block diagram of a prior art communication devices including channel encoders and channel decoders.

As is also known, there are a variety of block coding schemes including linear block encoding, Reed-Solomon encoding, cyclic encoding, and BCH (Bose-Chadhuri-Hocquenghem) encoding, etc. FIG. 1 is a schematic block diagram of a transmitting communication device providing prepared information to a receiving communication device that utilizes BCH encoding. The transmitting communication device includes a data source, channel encoder, and a modulator. The receiving communication device includes a demodulator, channel decoder, and a data destination. The channel represents the communication system infrastructure.

The data source of the transmitting communication unit generates the original information as a series of k-bit data messages (u) that may be represented as polynomials [e.g., $u(x)=u_0 x^0 + u_1 x^1 + u_2 x^2 + \ldots + u_k X^k$]. Depending on the type of transmitting communication device, the data source may generate digitized voice messages, digitized audio messages, digitized video messages, text messages, data messages and/or a combination thereof. The channel encoder receives the k-bit data messages and converts them into n-bit code words (v) [e.g., $u(x)=v_0 x^0 + v_1 x^1 + v_2 x^2 + \ldots + v_n x^n$] based on a polynomial generator [G(x)]. Such BCH encoding will be described in greater detail with reference to FIGS. 5 and 6.

As is known, BCH block codes have unique mathematical properties. For instance, a modulo 2 addition of any two binary codewords yields another valid codeword. Further, only a small subset of available digital values, or vectors in an n dimensional vector space over GF(2), are included in the set of valid codewords, or code block, and have a certain number of bit positions (i.e., polynomial coefficients) that differ from each other codeword. The amount of difference between each valid code word with respect to the overall size of the codeword is generally referred to as a minimum distance ($d_{min}$). The minimum distance indicates how many bits of the received code word can be in error and still accurately decoded to recapture the original information. In general, the number of correctable bits (t) equals the minimum-distance minus 1 divided by two [i.e., $t=\frac{1}{2}(d_{min}-1)$].

For systematic encoding, the resulting n-bit codeword (v) includes the k-bit data message (u) and also includes n–k parity message. For BCH encoding, the k-bits of the data message and the n–k parity bits correspond to coefficients of the resulting polynomial codeword [v(x)]. The values of n and k vary depending on the size of the BCH block code. For example, a simple form of BCH block coding has an n of 7 (i.e., the codewords are seventh order polynomials) and a k of 4 (i.e., the data messages are fourth order polynomials). Of course, the values of n and k may increase to relatively large numbers. For example, n may be $2^{14}$ (e.g., 16,384) and k may be 15,368.

Figure 2:
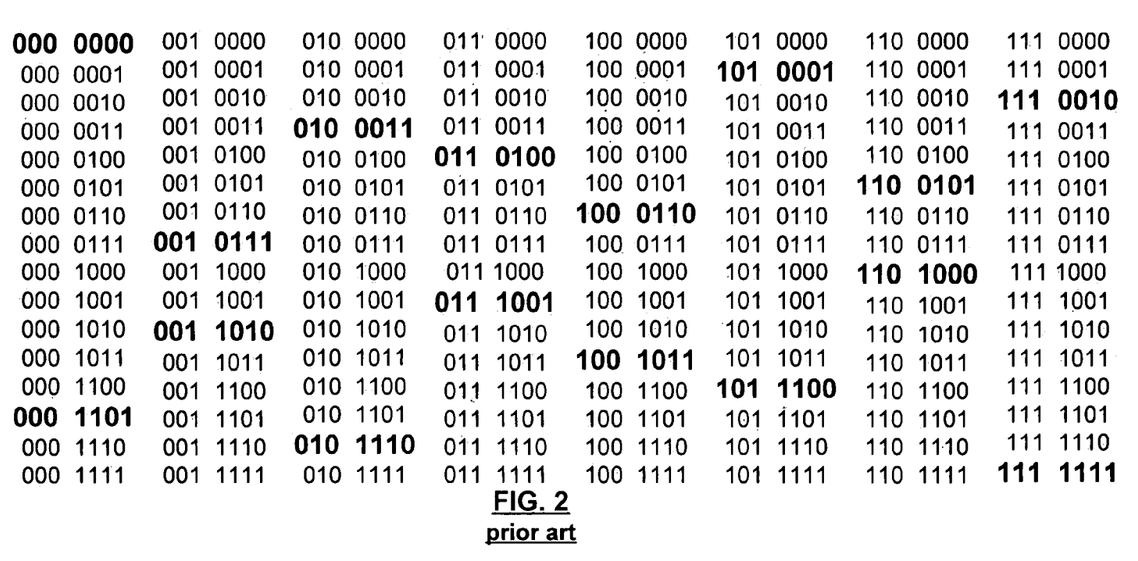
FIGS. 2 and 3 illustrate prior art examples of a 7 by 4 linear code block that includes 16 code words.
Figure 3:
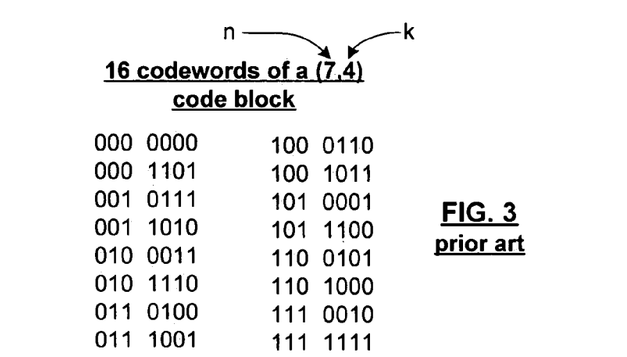

As mentioned above, encoding is based on mathematical properties that result is a set of codewords that is a small subset of all possible digital values. For example, as illustrated in FIG. 2, a 7-bit word has 128 different values, yet a (7, 4) [i.e., n=7 and k=4] code block includes only 16 digital values as valid codewords, which are shown in bold in FIG. 2 and summarized in FIG. 3. The first three bits, which are in bit positions 0–2, are the n–k parity bits and the remaining four bits, which are in bit positions 3–6, are the k data message bits. As can be seen, each codeword differs from each other codeword in at least three bit positions. For example, codeword 001 0111 differs from codeword 001 1010 in the third, fourth, and sixth bit positions. Thus, this code block has a minimum distance of three. Accordingly, this code block has one-bit error correcting capabilities (i.e., $t=\frac{1}{2}(3-1)=1$).

Figure 4:
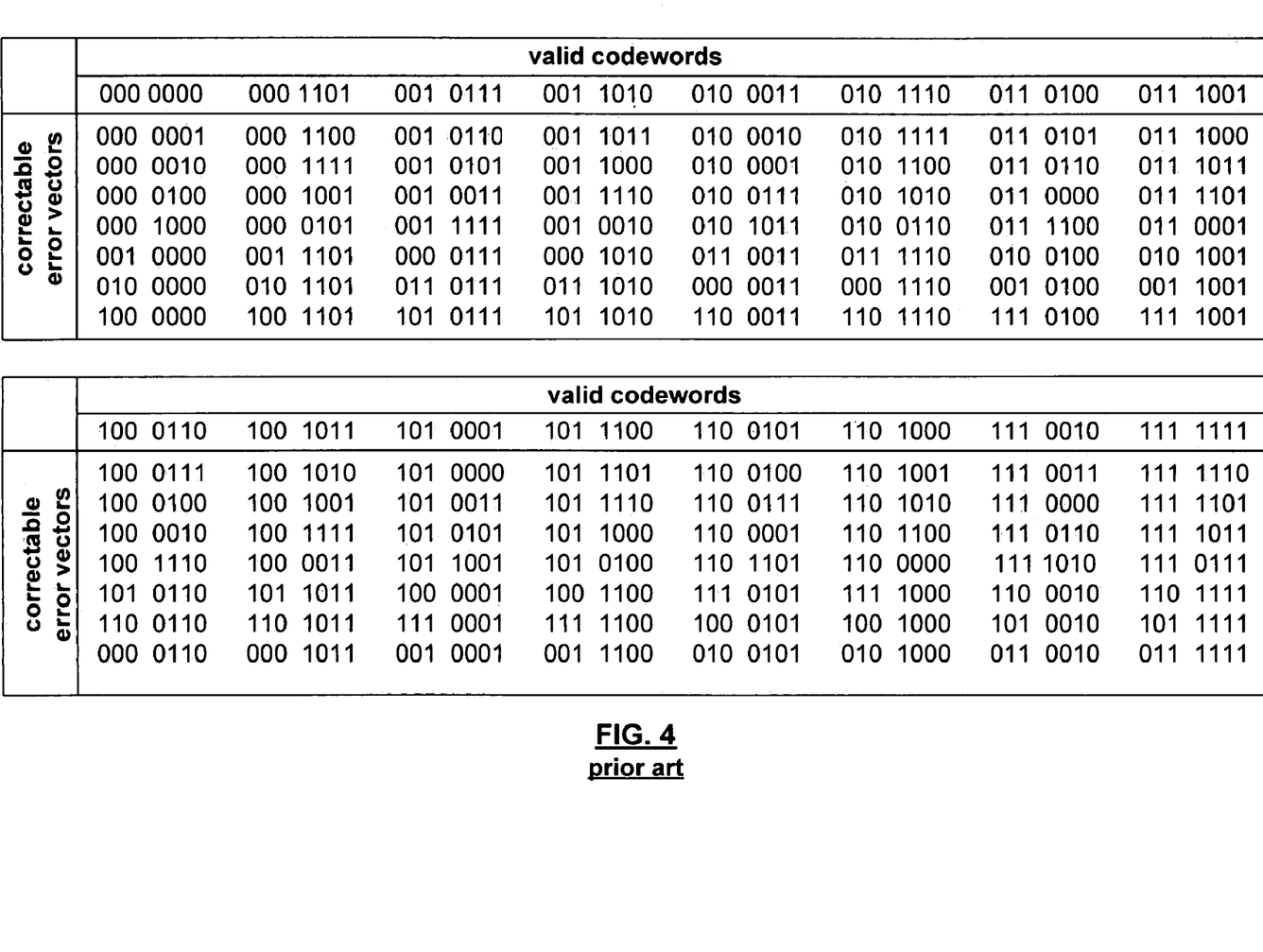
FIG. 4 is a graphical representation of correctable error vectors and corresponding valid code words.

FIG. 4 illustrates an example of correctable error vectors (i.e., received words that are not valid codewords but differ from a valid codeword by 1 bit). For example, received digital words 000 0001, 000 0010, 000 0100, 000 1000, 001 0000, 010 0000, and 100 0000 may be corrected to valid codeword 000 0000, since they differ by only one bit from the valid code word 000 0000. As such, as long as the received digital word differs from a valid codeword in t (number of correctable bits) or fewer bit locations, the received word may be accurately decoded to recapture the original data message.

Returning to the discussion of FIG. 1, the modulator modulates the n-bit codeword (v) utilizing a modulation scheme in accordance with one or more standards to which the transmitting communication device is compliant. For example, the modulation may be done in accordance with one or more wireline communication standards, wireless communication standards, etc. The modulated code word is then transmitted via a wireline or wireless communication channel to the receiving communication device.

Within the receiving communication unit, the demodulator receives a digital word (r), which corresponds to the transmitted codeword (v) plus any error (e) that was introduced by the channel (or storage element). The demodulator demodulates the received word (r) in accordance with the standard or standards in which the codeword (v) was modulated to produce a demodulated received polynomial r(x).

The channel decoder receives the demodulated received polynomial r(x) and determines whether the received polynomial corresponds to a valid code word, which is typically done by calculating the syndrome. Syndrome, which will be described in greater detail with reference to FIGS. 7 and 8, generally corresponds to a remainder value when the received polynomial r(x) is divided by the polynomial generator [g(x)]. When the syndrome is zero, i.e., the remainder was zero, then the received polynomial corresponds to a valid code word. If at least one syndrome values is not zero, i.e., the remainder was not zero, then the received polynomial does not correspond to a valid codeword.

If the received polynomial corresponds to a valid codeword, the codeword is processed to recapture the original data message (u). In practice, for systematically encoded data messages, the original data message is obtained by simply extracting the first k-bits of the valid codeword. The data destination receives the recovered data message and processes it accordingly.

If the received, polynomial [r(x)] does not correspond to a valid code word, the channel decoder determines the error introduced by the channel based on the syndrome values. In essence, the determination of the error is determining which one of a plurality of error patterns that produce the same syndrome as the received polynomial [r(x)], is the most likely error pattern, or error polynomial, that distorted the transmitted codeword [v(x)]. Typically, the error pattern of the plurality of error patterns will be the one having the least number of ones. The determination of the error pattern will be described in greater detail with reference to FIGS. 7 and 9.

Having determined the error pattern the channel decoder determines the bit location, or locations, of the received polynomial [r(x)] that are in error based on the error pattern. Once the bit location, or locations, of error are identified, the decoder corrects the received polynomial accordingly to recapture a valid codeword. The recovered data message (u) is extracted from the valid codeword (v) as previously described.

Figure 5:
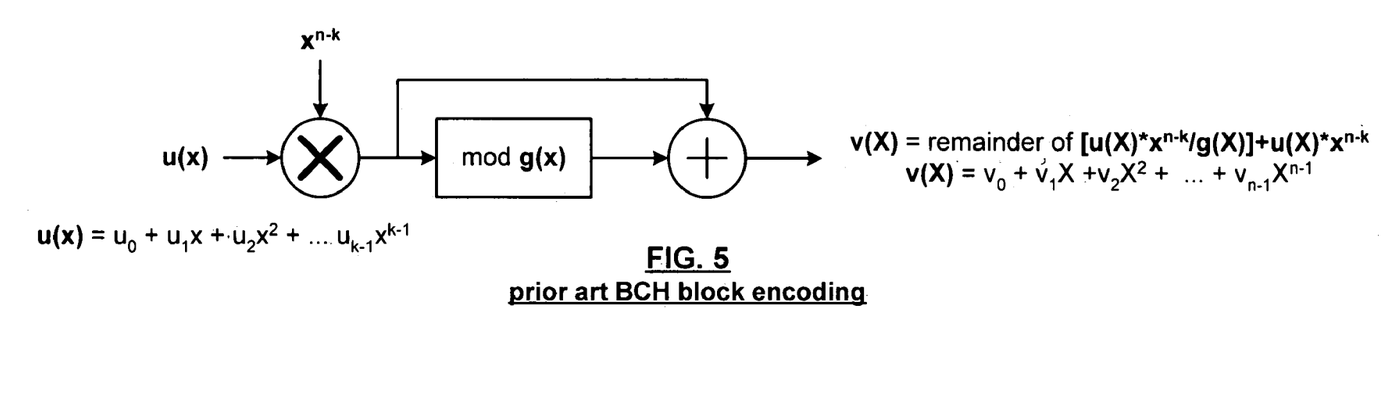
FIG. 5 is a schematic block diagram of a prior art BCH block encoder.

FIG. 5 is a graphical representation of a prior art BCH (Bose-Chaudhuri-Hocquenghem) block encoder. In general, BCH block encoding utilizes a generator polynomial [g(x)] to produce a codeword [v(x)] in a polynomial form. As shown, the data message (u) is treated as a polynomial [u(x)], where the coefficients of the polynomial are the bits of the data message, where $u_0$ is a coefficient for $x^0$, $u_1$ is a coefficient for $x^1$, $u_2$ is a coefficient for $x^2$, . . . , and $u_{k-1}$ is a coefficient for $x^{k-1}$. The coefficient of the highest degree of x is transmitted first.

For systematic encoding (i.e., the k-bit data message is included, unaltered and in order, in the resulting codeword with the parity bits), the data message polynomial [u(x)] is multiplied by $x^{n-k}$ to raise the power to correspond to the power of the n-bit codeword polynomial [v(x)]. The resulting product of [u(x)] times $x^{n-k}$ is modulo divided by the generator polynomial [g(x)]. The generator polynomial is the least common multiple of, one or more minimal polynomials of $\alpha, \alpha^2, \alpha^3, \ldots, \alpha^{2t}$, where $\alpha$ is a primitive element of the GF(m), with $m=2^n-1$.

The remainder of the modulo division of [u(x)] times $x^{n-k}$ by the generator polynomial [g(x)] is summed with the product of [u(x)] times $x^{n-k}$ to produce the code word polynomial v(x), where $v(x)=v_0+v_1x+v_2x^2+ \ldots +v_{n-1}x^{n-1}$. Accordingly, $v_{n-1}$ corresponds to $u_{k-1}$, $V_{n-2}$ corresponds to $u_{k-2}, \ldots, v_{n-k+1}$ corresponds to $u_1$, and $v_{n-k}$ corresponds to $u_0$. Further, $v_{n-k-1}$ corresponds to parity bit $p_{n-k-1}, \ldots, v_1$ corresponds to $p_1$, and $v_0$ corresponds to $p_0$.

Figure 6:
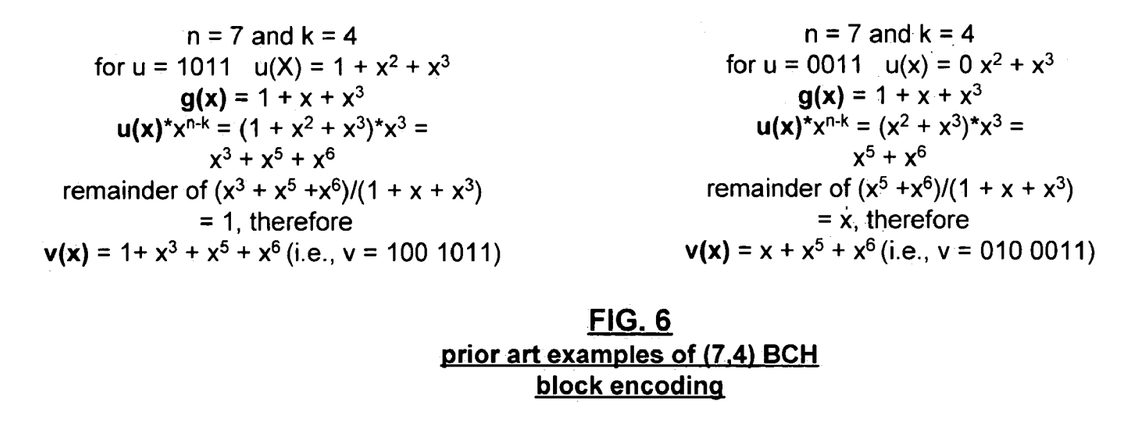
FIG. 6 is a graphical representation of examples of (7, 4) BCH encoding.

FIG. 6 illustrates two prior art examples of a (7, 4) BCH block encoding, where n=7 and k=4. In the first example, a data message of 1011 is converted into a corresponding data message polynomial $u(x)=1+x^2+x^3$. For a (7, 4) single bit correction code block, the polynomial generator $g(x)=1+x+x^3$. The data message polynomial is multiplied by $X^{n-k}$, where n-k equals 3 in this example producing a result of $x^3+x^5+x^6$. This resultant is then divided by $1+x+x^3$, yielding a remainder of 1. Adding the remainder to the product of $u(x)*x^{n-k}$ produces the codeword polynomial $v(x)=1+x^3+x^5+x^6$, which in a linear block binary form corresponds to a codeword of 1001011.

The second example has a data message of 0011, which is converted into a data message polynomial $u(x)=x^2+x^3$. Multiply the data message polynomial by $x^{n-k}$, where n-k equals 3 in this example, yields $x^5+x^6$. Dividing the resulting product by the generator polynomial g(x), which is the same as in the first example, i.e., $1+x+x^3$, produces a remainder of x. Adding the remainder to the product of $u(x)*x^{n-k}$ produces the codeword polynomial $v(x)=x+x^5+x^6$, which in a linear block binary form corresponds to a codeword of 0100011.

Figure 7:
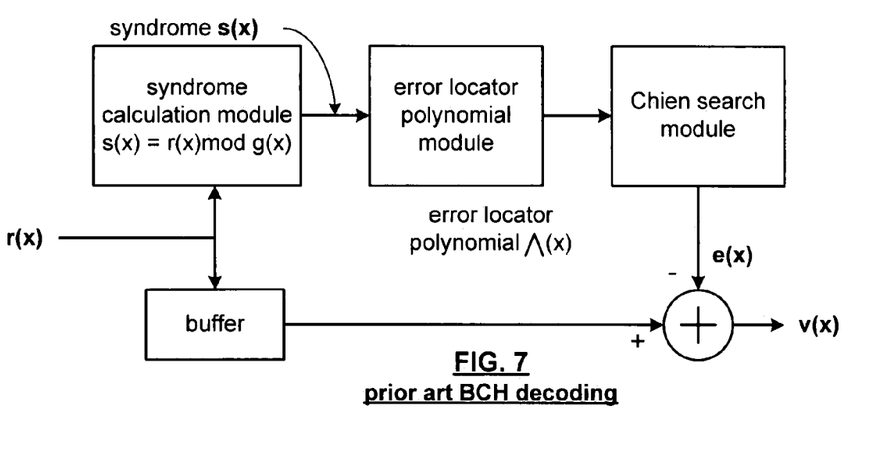
FIG. 7 is a schematic block diagram of a prior art BCH decoder.

FIG. 7 is a schematic block diagram of a prior art BCH decoder that includes a buffer, syndrome calculation module, error locator polynomial module, Chien search module and a subtraction module. The received polynomial r(x) is stored in the buffer and provided to the syndrome calculation module. In general, the syndrome calculation module performs a modulo division of the received polynomial r(x) by the polynomial generator g(x) to produce a plurality of syndrome values s(x). In mathematical terms, the syndrome values are defined as $S_i=R(\alpha^i)$, where R(x) is the remainder polynomial. If the remainder is 0, then the syndrome is 0, which indicates that the received polynomial r(x) is a valid codeword polynomial. If the remainder is not 0, then the syndrome is not 0, which indicates that the received polynomial r(x) includes error. A more detailed discussion of the syndrome calculation module will be provided with reference to FIG. 8.

The error locator polynomial module, which may perform a Berlekamp-Massey algorithm or Euclid's algorithm, receives the syndrome values and determines an error locator polynomial $\Lambda(x)$.

The Chien search module, which will be described in greater-detail with reference to FIG. 10, receives the error locator polynomial $\Lambda(x)$ and determines the location of the error in the received polynomial therefrom. In general, the Chien search module tests potential error locations in succession starting with at a given time and exhausts all possible error locations to determine the actual error locations. After completion of the testing, the error locations are provided to the subtraction module, which removes the error from the received word, yielding a valid codeword polynomial.

Figure 8:
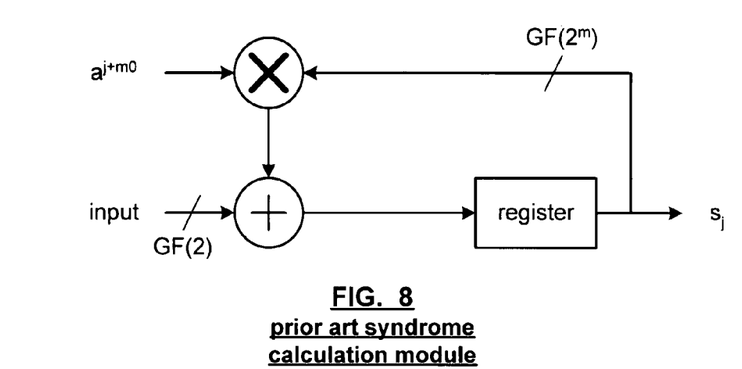
FIG. 8 is a schematic block diagram of a prior art syndrome calculation module.

FIG. 8 is a schematic block diagram of a prior art syndrome calculation module that produces one of 2t (2 times the number of correctable bits) syndrome values for the prior art BCH decoder. As such, the syndrome calculation module includes a plurality of the circuits shown in FIG. 8 to calculate the syndrome values. As shown, a syndrome value calculation circuit includes an adder, a multiplier and a register. The multiplier is operably coupled to multiple the output of the register (i.e., an intermediate syndrome value) with a primitive element $\alpha^{j+m_0}$ (shown as $a^{j+m_0}$) of a $GF(2^m)$. The resulting product is added with the input (i.e., a coefficient of the received polynomial) to produce an intermediate syndrome value, which is stored in the register. As such, for each clock cycle, the degree is reduced by one since the values of the syndrome are in $GF(2^m)$ space.

For high data rate applications that may require a large n, k, and t (i.e., number of bits in the code word, number of bits in the data message, and number of correctable bits), the syndrome calculation module of FIG. 8 has several issues that limit its applicability to lower n, k, t applications. For instance, the syndrome calculation module may be required to process m symbols per clock cycle, which for high data rate applications requires an excessively fast circuitry. In addition, the number of multipliers is significant (e.g., 146 for a minimum distance (t) of 147), thus requiring a significant amount of integrated circuit die area. As such, the syndrome calculation module of FIG. 8 would be quite cumbersome and would be too slow for high data rate applications that may include high values of n, k, t (e.g., $n=2^{14}$, k=15,368, and t=74).

Figure 9:
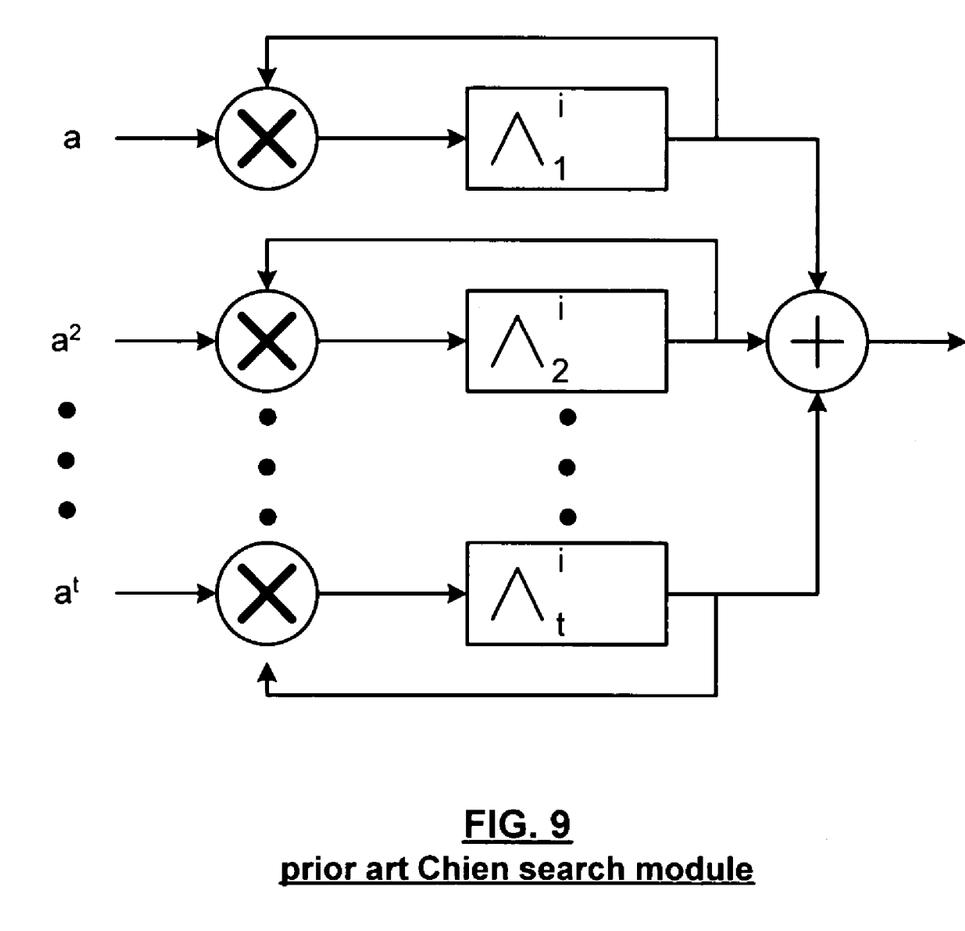
FIG. 9 is a schematic block diagram of a prior art Chien search module.

FIG. 9 is a schematic block diagram of a Chien search module that includes a plurality of multipliers, registers and a summation module, where $\alpha^1$ through $\alpha^i$ are power of the primitive element. In this configuration, summing the register outputs at index (i) tests whether $\Lambda(\alpha^{-i})=0$. If so, $\alpha^{-i}$ is a root of the error locator polynomial and indicates an error exists at the indexed location. To test at index i−1 requires multiplying the $k^{th}$ register contents by $\alpha^k$ for all k in $\Lambda^{i-1} = \Lambda_k^i \alpha^k$ and summing the contents again. This procedure is repeated until the index reaches 0. As such, regardless of whether the received polynomial includes 1 error or up to t errors, the Chien search module does a complete analysis of the error locator polynomial as just described. Accordingly, the same amount of processing time and power consumption is expended regardless of whether the received polynomial has one error or the maximum allowable.

Therefore, a need exists for a method and apparatus of decoding BCH and/or Reed-Solomon encoded signals for high-data, rates that minimizes power consumption and processing resources.

BRIEF SUMMARY OF THE INVENTION

These needs and others are substantially met by the decoding of a BCH encoded signal of the present invention. In one embodiment of a method or apparatus, the decoding of a BCH encoded signal begins by determining whether the received BCH encoded signal includes error. For example, a syndrome calculation may be performed to determine whether error exists in the received BCH encoded signal. In general, the syndrome calculation involves dividing the received BCH encoded signal by a generator polynomial (i.e., the polynomial used to generate all valid codewords) and interpreting the remainder, which represents the error present in the BCH encoded signal. If the remainder is zero, then the received BCH encoded signal does not include errors. If the remainder is not zero, then the received BCH encoded signal includes error.

The decoding process continues when the received BCH encoded signal includes error by determining whether the error is correctable. This may be done by determining a number of errors of the received BCH encoded signal, identifying bit locations of the received BCH encoded signal having the error; counting the number of bit locations of the received BCH encoded signal having the error, comparing the number of errors to the degree of the error locator polynomial of the code word, when the number of bit locations found by Chien search module is equal to the degree of the error locator polynomial, ceasing the identifying of the bit locations of the received BCH encoded signal having the error, and correcting information contained in the bit locations of the received BCH encoded signal having the error when the identifying of the bit locations is ceased.

Having determined the error locator polynomial, a Chien search algorithm is performed on the error locator polynomial to identify the location of the error. However, in contrast with prior art Chien search algorithms, which analyze every possible error location even without regard to whether all the errors have been found, the present implementation of the Chien search algorithm counts each error location that it identifies and compares the number of errors found to the number of errors that exist in the received BCH encoded signal. The number of errors that exist in the BCH code corresponds to the degree of the error locator polynomial. For example, if the error locator polynomial is $1+x^3+x^8$, the degree of this polynomial is eight. Note that if the code word contains an uncorrectable number of errors, the number of errors exceeds t and the error locator polynomial is invalid causing the Chien search algorithm to perform an exhaustive search.

When the code word includes a correctable number of errors and once the number of errors found equals the degree of the error locator polynomial, the Chien search algorithm is stopped, which reduces power consumption of BCH decoders, especially ones implemented on an integrated circuit. For example, under normal conditions, for large block codes [e.g., a (16,383, 15,368, 147) code block where each codeword includes 16,383 bits, of which 15,368 correspond to the data message, and can have up to ½(147−1) =73 correctable errors] a significant amount of power is saved on average, since, statistically, received codewords have only a small number of errors in comparison to the number of correctable errors. Typically, the number of errors found in Chien search is less or equal to the degree of error locator polynomial. If more, the received word is uncorrectable. Otherwise, it is correctable. In other words, if a complete Chien search algorithm is performed and the number of roots found is still less than the degree of the error locator polynomial, then the code word is uncorrectable.

DETAILED DESCRIPTION OF THE INVENTION

Figure 10:
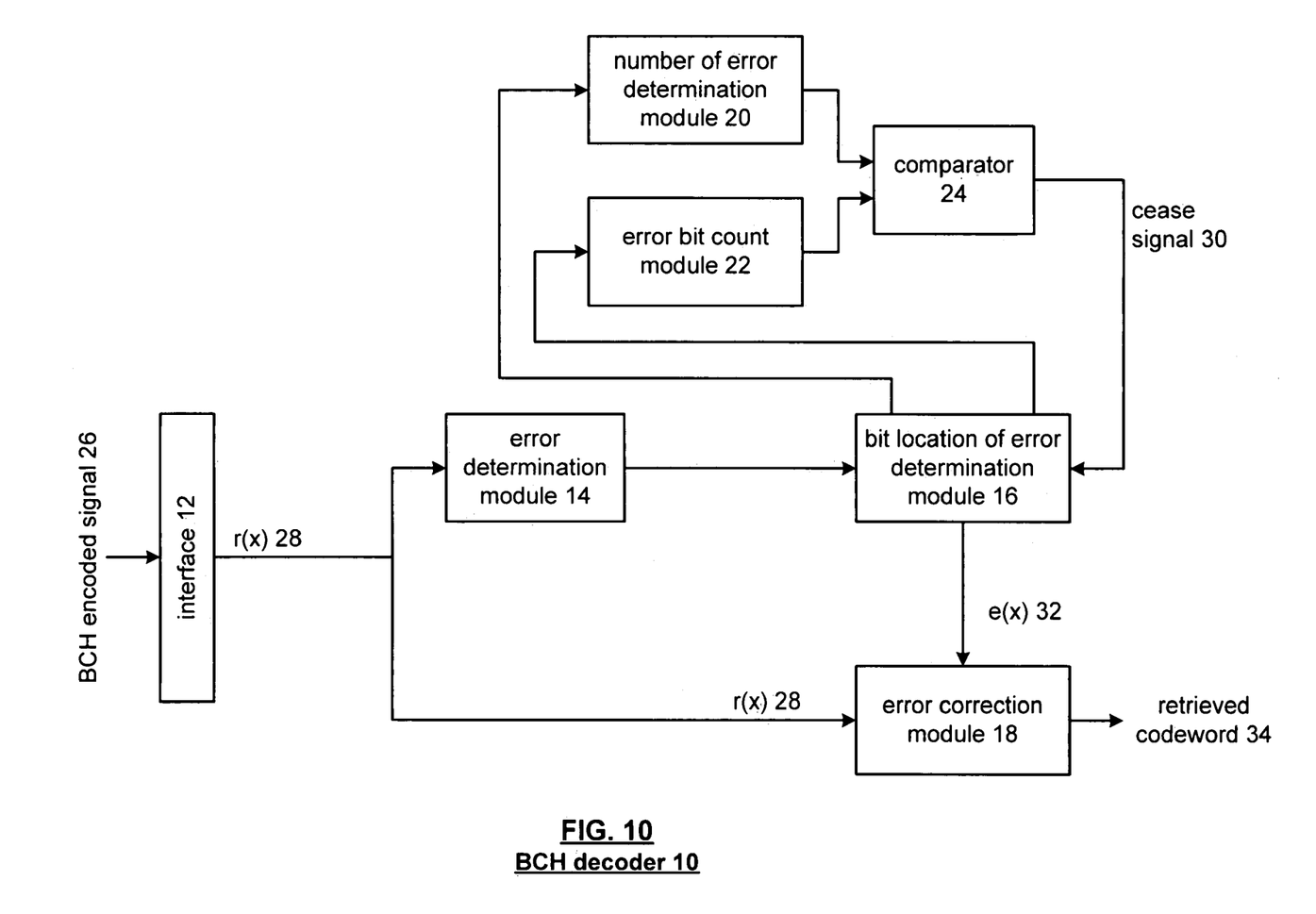
FIG. 10 is a schematic block diagram of a BCH decoder in accordance with the present invention.

FIG. 10 is a schematic block diagram of a BCH decoder 10 that includes an interface 12, an error determination module 14, a bit location of error determination module 16, an error correction module 18, a number of error determination module 20, an error bit count module 22, and a comparator 24. The interface 12, which may include a demodulator, receives a BCH encoded signal 26 in a polynomial format. In general, the received polynomial BCH encoded signal 26 is $r(x)=r_0x^0+r_1X^1+r_2x^2+r_3x^3+ \ldots + r_{n-1}x^{n-1}$, with the highest order term generally being received first. The interface 12 provides the received signal 26 to the error determination module 14 and to the error correction module 18.

The error determination module 14 interprets the received signal 26 to determine if it is a valid codeword for the given code block. For example, if the code block is a (7, 4) code block (where n=7 and indicates the number of bits in the codeword and k=4 and indicates the number of bits in the data message), then there are 16 valid codewords. One approach for making such a determination is a comparison of the received word with a list of valid codewords. Another approach is to calculate a syndrome of the received word by dividing the received word by a generator polynomial (i.e., the polynomial used to create all of the codewords in the code block). By definition, dividing a codeword by the generator polynomial yields a remainder of zero. Further, the received word equals the transmitted codeword plus error introduced by the channel [i.e., r(x) v(x)+e(x)]. Thus, dividing r(x) by g(x) is equal to v(x)/g(x)+e(x)/g(x), since by definition v(x)/g(x)=0, the syndrome calculation is e(x)/g(x). Accordingly, the syndrome calculation yields a syndrome of zero when the received word is a valid codeword and a non-zero syndrome when the received word is not a valid codeword.

The bit error location of error determination module 16 receives the syndrome and determines therefrom the most likely error polynomial of the error introduced by the channel and then calculates the bit location of the error in the received BCH encoded signal. If the syndrome is zero, the resulting error-polynomial is zero, and there are no bit locations of the received BCH encoded signal that are in error. When the syndrome is not zero, module 16 determines the error patterns or error polynomials, that would produce the same syndrome as the received BCH encoded signal. From error polynomials or error patterns identified, one is selected as the most likely error polynomial or error pattern. Typically, the error pattern or error polynomial having the least number of ones is selected.

Having determined the error polynomial, the number of error determination module 20 interprets the error locator polynomial to determine the number of errors in the received BCH encoded signal. In one embodiment, the error determination module 20 interprets the degree of the error locator polynomial to establish the number of errors in the received BCH encoded signal 26. For example, if the error locator polynomial is $1+x^3+x^8$, the degree of this polynomial is eight and hence includes up to eight errors.

With the error locator polynomial and the number of errors in the received BCH encoded signal determined, the bit location of error determination module 16 interprets the error locator polynomial to find the location of error in the BCH encoded signal. For each error identified, the error bit count module 22 increments an error location count. The comparator 24 compares the error location count with the number of errors that exist in the BCH encoded signal. When the number of errors found equals the number of errors that exist, the comparator 24 generates a cease signal 30, which, for this BCH encoded signal, ceases the search for errors in the BCH encoded signal. Having identified the location of the errors, the error correction module 18 corrects the received BCH encoded signal 26 to produce a retrieved codeword 34.

If, after all of the possible locations of errors have been checked and the number of errors found is less than the number of errors that exist, then the received word includes too many errors for accurate decoding. Accordingly, a request for retransmission may be sent to the transmitting communication device, an acknowledgement (ACK) signal omitted (i.e., indicating the error by omission of an ACK), and/or another mechanism may be employed to compensate for the errant received word.

Figure 11:
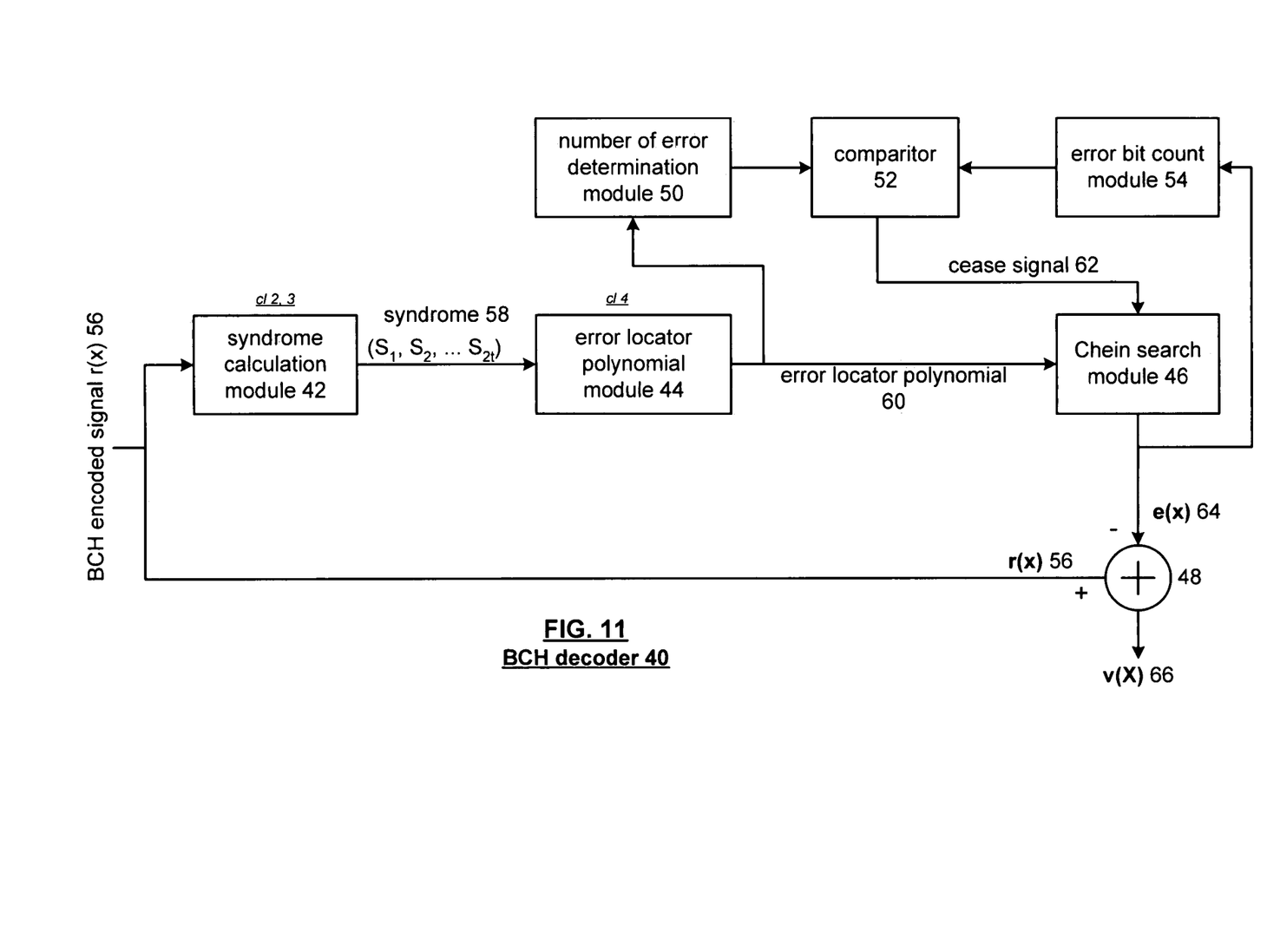
FIG. 11 is a schematic block diagram of another BCH decoder in accordance with the present invention.

FIG. 11 is a schematic block diagram of a BCH decoder 40 that includes a syndrome calculation module 42, an error locator polynomial module 44, Chien search module 46, a subtraction module 48, a number of error determination module 50, an error bit count module 54, and a comparator 52. The syndrome calculation module 42 and the subtraction module 48 receive a BCH, encoded signal 56 in a polynomial format. In general, the received polynomial BCH encoded signal 56 is $r(x)=r_0x^0+r_1X^1+r_2x^2+r_3x^3+ \ldots + r_{n-1}x^{n-1}$.

The syndrome calculation module 42 divides the received word [r(x)] by a generator polynomial [g(x)] (i.e., the polynomial used to create all of the codewords in the code block) and analyzing the remainder. By definition, dividing a codeword by the generator polynomial yields a remainder of zero. Further, the received word equals the transmitted codeword plus error introduced by the channel [i.e., r(x)=v (x)+e(x)]. Thus, dividing r(x) by g(x) is equal to v(x)/g(x)+ e(x)/g(x), since by definition v(x)/g(x)=0, the syndrome calculation is e(x)/g(x). Accordingly, the syndrome calculation yields a syndrome 58 ($s_0$, $s_1$, ... $s_{2t}$) of zero when the received word is a valid codeword and a non-zero syndrome when the received word is not a valid codeword.

The error locator polynomial module 44 receives the syndrome 58 and determines therefrom the most likely error polynomial 60 that represents the error introduced by the channel. If the syndrome 58 is zero (i.e., $s_1$=0, $s_2$=0, ..., $s_{2t}$=0), the resulting error polynomial is zero. When the syndrome is not zero (i.e., at least one of $s_1$, $s_2$, $s_3$, ... $s_{2t}$ is not zero), the error locator polynomial module 16, which may use a Berlekamp-Massey or Euclid algorithm, determines the most likely error polynomial from a plurality of error polynomials that produce the same syndrome 58 as the received BCH encoded signal 56: Typically, the selected error polynomial 60 is the one having the least number of ones.

Having determined the error locator polynomial 60, the number of error determination module 50 interprets the error locator polynomial 60 to determine the number of errors in the received BCH encoded signal 56. In one embodiment, the number of error determination module 50 interprets the degree of the error locator polynomial 60 to establish the number of errors in the received BCH encoded signal 26. For example, if the error locator polynomial 60 is $1+x^3+x^8$, the degree of this polynomial is eight.

With the error polynomial 60 and the number of errors in the received BCH encoded signal 56 determined, the Chien search module 16 interprets the error locator polynomial 60 to find the location(s) of error(s) in the BCH encoded signal as described with reference to FIG. 9, with the following exceptions. For each error identified, the error bit count module 54 increments an error location count. The comparator 52 compares the error location count with the number of errors that exist in the BCH encoded signal. When the number of errors found equals the number of errors that exist, i.e., the degree of the error locator polynomial, the comparator 52 generates a cease signal 62, which, for this BCH encoded signal, causes the Chien search module 46 to cease the search for errors in the BCH encoded signal. This may be done by setting the index value to zero or other disabling mechanism. Having identified the location of the errors, the subtraction module 48 corrects the received BCH encoded signal 56 by effectively subtraction the error 64 therefrom to produce a retrieved codeword v(x) 66.

If, after all of the possible locations of errors have been checked and the number of errors found is less than the number of errors that exist, then the received word includes too many errors for accurate decoding. Accordingly, a request for retransmission may be sent to the transmitting communication device, an acknowledgement (ACK) signal omitted (i.e., indicating the error by omission of an ACK), and/or another mechanism may be employed to compensate, for the errant received word.

Figure 12:
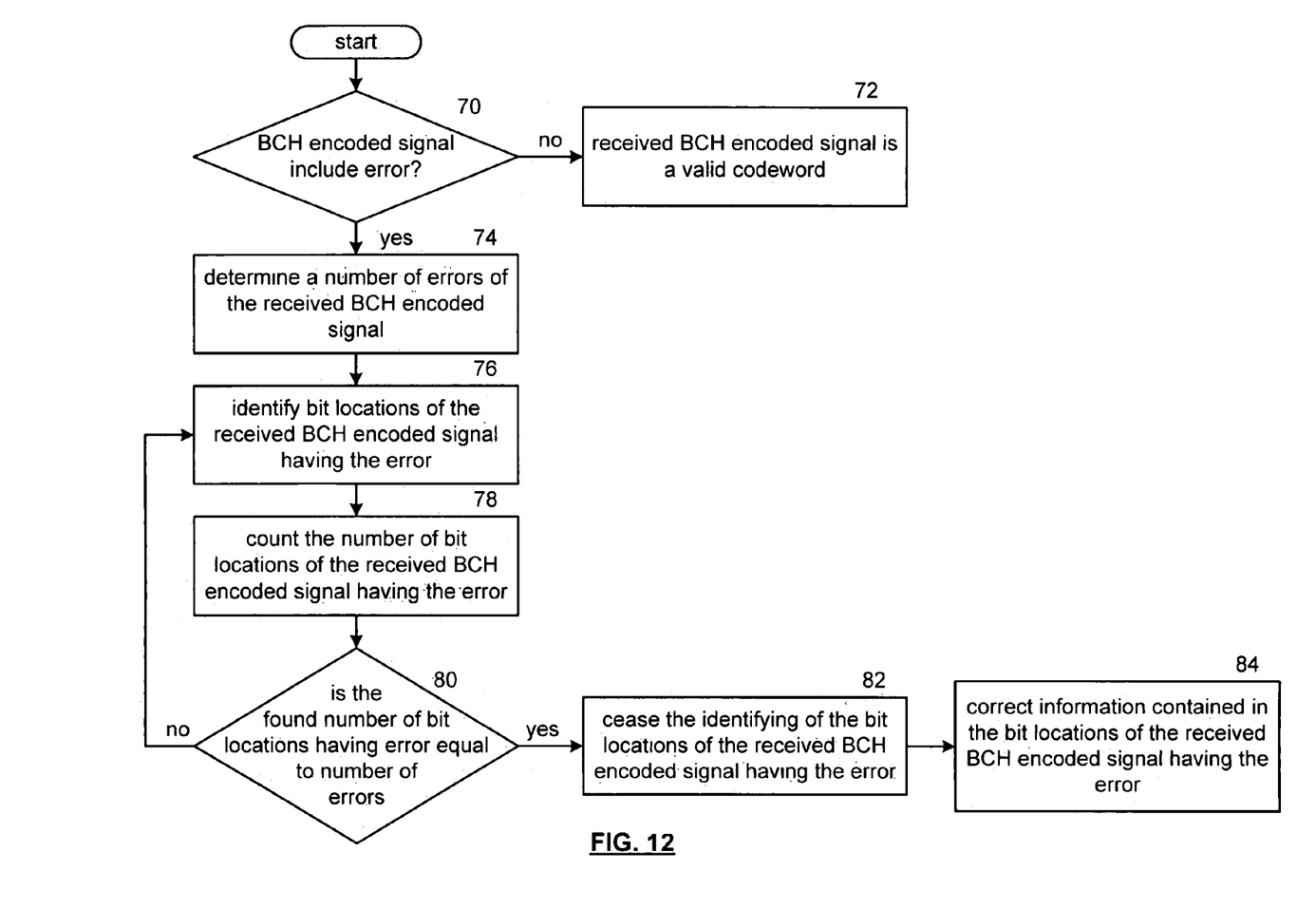
FIG. 12 is a logic diagram of a method for decoding BCH encoded signal in accordance with the present invention.

FIG. 12 is a logic diagram of a method for decoding a received Bose-Chadhuri-Hocquenghem (BCH) encoded signal. The method begins at step 70 where a decoder determines whether the received BCH encoded signal includes error. The decode may determine whether the received BCH encoded signal includes error by generating syndrome values of the received BCH encoded signal, interpreting the syndrome values, and when the syndrome values do not equal zero, determining that the received BCH encoded signal includes errors. The decoder may generate the syndrome values by dividing a polynomial representation of the received BCH encoded signal by a generator polynomial to produce a quotient polynomial and a remainder polynomial. The decoder then utilizes a primitive element of the corresponding finite field to Produce the syndrome values from the remainder polynomial.

If the received BCH encoded signal does not include error, the method proceeds to step 72 where the received BCH encoded signal is a valid codeword. If, however, the received BCH encoded signal includes error, the method proceeds to step 74 where the decoder determines a number of errors of the received BCH encoded signal. The decoder may determine the number of errors by identifying an error locator polynomial Having identified the error locator polynomial, the decoder interprets its degree to, determine the number of errors in the received BCH encoded signal.

The method then proceeds to step 76 where the decoder identifies bit locations of the received BCH encoded signal having the error. The decoder may determine the bit locations by identifying the non-zero roots of the error locator polynomial and corresponding the non-zero roots to the bit locations of the received BCH encoded signal having the error. In embodiment, this step 76 may be performed by a Chien search algorithm, where a zero root indicates a non-correctable code word.

The method then proceeds to step 78 where the decoder counts the number of bit locations of the received BCH encoded signal having the error. The method then proceeds to step 80 where the decoder determines whether the number of bit error locations found equals the number of bit errors that exist. If not the process repeats at step 76. If, however, the number of error locations found equals the number of bit errors that exist, the method proceeds to step 82 where the decoder ceases the identifying of the bit locations of the received BCH encoded signal having the error. The method then proceeds to step 84 where the decoder corrects information contained in the bit locations of the received BCH encoded signal having the error when the identifying of, the bit locations is ceased.

Figures 13, 14:
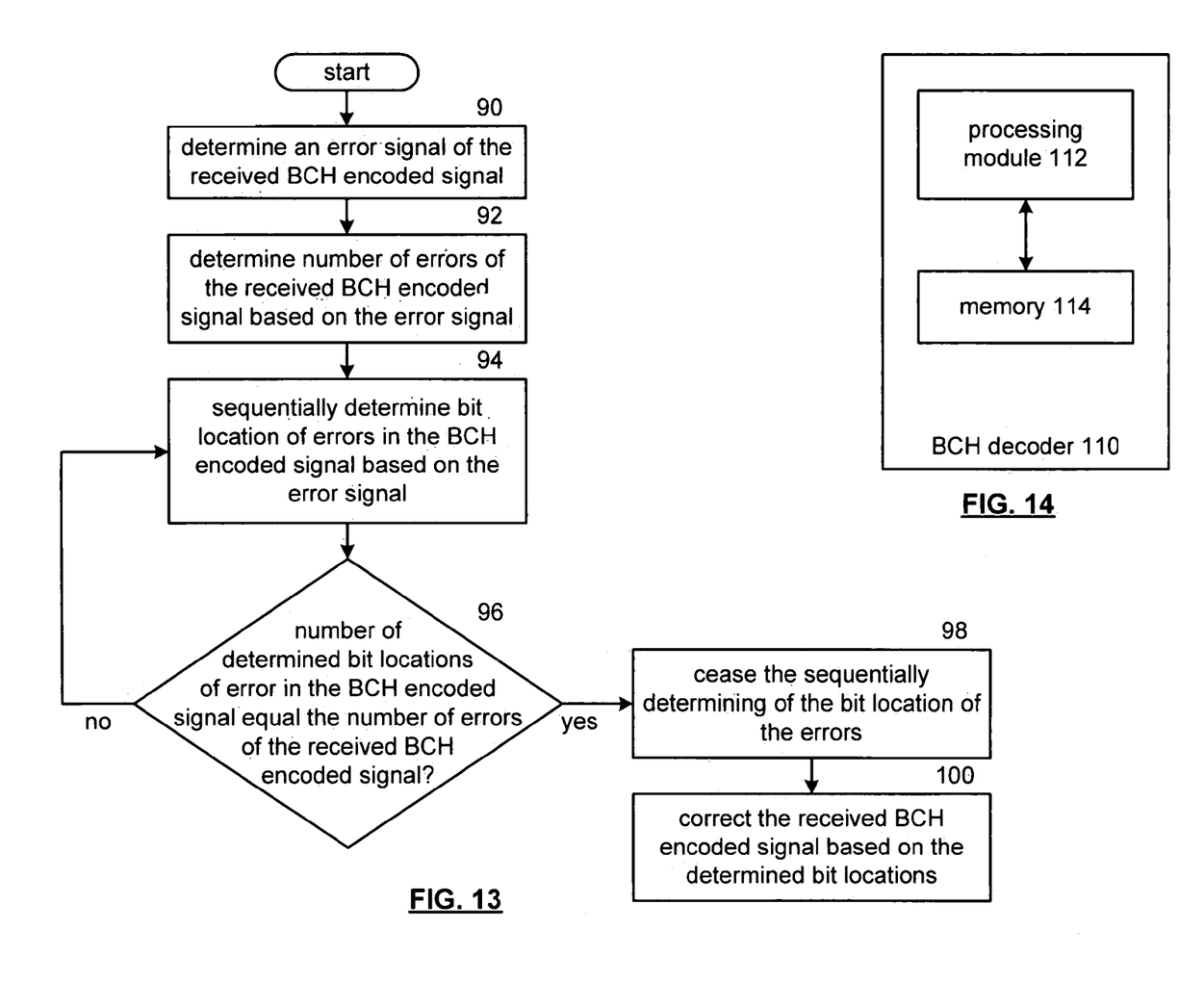
FIG. 13 is a logic diagram of another method for decoding BCH encoded signal in accordance with the present invention.
FIG. 14 is a schematic block diagram of yet another BCH decoder in accordance with the present invention.

FIG. 13 is a logic diagram of a method for decoding a received Bose-Chadhuri-Hocquenghem (BCH) encoded signal when the received BCH encoded signal includes error. The method begins at step 90 where the decoder determines an error signal of the received BCH encoded signal, wherein the received BCH encoded signal corresponds to a transmitted BCH encoded signal plus the error signal. The method then proceeds to step 92 where the decoder determines the number of errors of the received BCH encoded signal based on the error signal (e.g., an error locator polynomial). The method then proceeds to step 94 where the decoder sequentially determines bit location of errors in the BCH encoded signal based on the error signal, which may be done using a Chien search algorithm.

The method then proceeds to step 96 where the decoder determines whether the number of identified bit locations having error equals the number of errors in the BCH encoded signal. If not, the method repeats at step 94. If, however, the number of identified bit locations having error equals the number of errors in the BCH encoded signal, the method proceeds to step 98. At step 98 the decoder ceases the sequentially determining of the bit location of the errors. The method then proceeds to step 100 where the decoder corrects the received BCH encoded signal based on the determined bit locations.

FIG. 14 is a schematic block diagram of a BCH decoding apparatus 110 that includes a processing module 112 and memory 114. The processing module 112 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry and/or any device that manipulates signals (analog and/or digital) based on operational instructions. The memory 114 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 112 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 114 stores, and the processing module 112 executes, operational instructions corresponding to at least some of the steps and/or functions illustrated in FIGS. 19 and 20.

The preceding discussion has presented a method and apparatus for decoding BCH encoded signals with less power consumption than prior art BCH decoders. Power savings is obtained by stopping the search for bit error locations in the received BCH encoded signal when the errors that exist in the BCH encoded signal have been found. As one of average skill in the art will appreciate, other embodiments may be derived from the teachings of the present invention without deviating from the scope of the claims. For example, the same method and apparatus may be used to process Reed-Solomon encoded signals where the term BCH encoded signals of the claims should be interpreted to include Reed-Solomon encoded signals.

What is claimed is:

1. A method for decoding a received Bose-Chadhuri-Hocquenghem (BCH) encoded signal, the method comprises:
   determining whether the received BCH encoded signal includes error;
   when the received BCH encoded signal includes error, determining whether the error is correctable by:
      determining a number of errors of the received BCH encoded signal;
      identifying bit locations of the received BCH encoded signal having the error;
      counting the number of bit locations of the received BCH encoded signal having the error;
      comparing the number of errors to the number of bit locations of the received BCH encoded signal having the error;
      when the number of bit locations of the received BCH encoded signal having the error equals the number of errors, ceasing the identifying of the bit locations of the received BCH encoded signal having the error; and
      correcting information contained in the bit locations of the received BCH encoded signal having the error when the identifying of the bit locations is ceased.

2. The method of claim 1, wherein the determining whether the received BCH encoded signal includes error further comprises:
   generating syndrome values of the received BCH encoded signal;
   interpreting the syndrome values; and
   when the syndrome values do not equal zero, determining that the received BCH encoded signal includes errors.

3. The method of claim 2, wherein the generating the syndrome values further comprises:
   dividing a polynomial representation of the received BCH encoded signal by a generator polynomial to produce a quotient polynomial and a remainder polynomial; and
   utilizing a primitive element of the BCH code block to produce the syndrome values from the remainder polynomial.

4. The method of claim 1, wherein the determining the number of errors of the received BCH encoded signal further comprises:
   identifying an error polynomial from a plurality of error polynomials, wherein each of the plurality of error polynomials produce a syndrome value equal to a syndrome value produce by the received BCH encoded signal;
   determining a degree of the error polynomial; and
   corresponding the number of errors to the degree of the error polynomial.

5. The method of claim 4, wherein the identifying bit locations of the received BCH encoded signal having error further comprises:
   identifying the non-zero roots of the error polynomial; and
   corresponding the non-zero roots to the bit locations of the received BCH encoded signal having the error.

6. The method of claim 5, wherein the identifying the non-zero roots of the error polynomial further comprises:
   performing a Chien search algorithm.

7. The method of claim 6, wherein the ceasing the identifying of the bit locations of the received BCH encoded signal having the error further comprises:
   ceasing performing the Chien search algorithm when the Chien search algorithm has identified the number of non-zero roots of the error polynomial equal to the degree of the error polynomial.

8. A method for decoding a received Bose-Chadhuri-Hocquenghem (BCH) encoded signal, the method comprises:
   when the received BCH encoded signal includes error:
      determining an error signal of the received BCH encoded signal, wherein the received BCH encoded signal corresponds to a transmitted BCH encoded signal plus the error signal;
      determining number of errors of the received BCH encoded signal based on the error signal;
      sequentially determining bit location of errors in the BCH encoded signal based on the error signal;
      when the number of determined bit locations of error in the BCH encoded signal equals the number of errors of the received BCH encoded signal, ceasing the sequentially determining of the bit location of the errors; and
      correcting the received BCH encoded signal based on the determined bit locations.

9. The method of claim 8 further comprises:
   when the number of determined bit locations of error in the BCH encoded signal equals the number of errors of the received BCH encoded signal, determining whether the sequentially determining bit locations of the errors has been exhausted by exceeding a number of correctable bits; and
   when the determining whether the sequentially determining bit locations of the errors has been exhausted, determining that the received BCH encoded signal includes too many errors for accurate decoding.

10. The method of claim 8, wherein the determining the error signal further comprises:
identifying an error polynomial from a plurality of error polynomials as the error signal, wherein each of the plurality of error polynomials in combination with the transmitted BCH encoded signal produce the received BCH encoded signal;
determining a degree of the error polynomial; and
corresponding the number of errors to the degree of the error polynomials.

11. The method of claim 10, wherein the sequentially determining bit location of errors in the BCH encoded signal further comprises:
identifying the non-zero roots of the error polynomial; and
corresponding the non-zero roots to the bit locations of the received BCH encoded signal.

12. The method of claim 11, wherein the identifying the non-zero roots of the error polynomial further comprises:
performing a Chien search algorithm.

13. The method of claim 12, wherein the ceasing the sequentially determining of the bit location of the errors further comprises:
ceasing performing the Chien search algorithm when the Chien search algorithm has identified the number of non-zero roots of the error polynomial equal to the degree of the error polynomial.

14. An apparatus for decoding a received Bose-Chadhuri-Hocquenghem (BCH) encoded signal, the apparatus comprises:
processing module; and
memory operably coupled to the processing module, wherein the memory stores operational instructions that cause the processing module to:
determine whether the received BCH encoded signal includes error;
when the received BCH encoded signal includes error, determine whether the error is correctable by:
determining a number of errors of the received BCH encoded signal;
identifying bit locations of the received BCH encoded signal having the error;
counting the number of bit locations of the received BCH encoded signal having the error;
comparing the number of errors to the number of bit locations of the received BCH encoded signal having the error;
when the number of bit locations of the received BCH encoded signal having the error equals the number of errors, ceasing the identifying of the bit locations of the received BCH encoded signal having the error; and
correct information contained in the bit locations of the received BCH encoded signal having the error when the identifying of the bit locations is ceased.

15. The apparatus of claim 14, wherein the memory further comprises operational instructions that cause the processing module to determine whether the received BCH encoded signal includes error by:
generating syndrome values of the received BCH encoded signal;
interpreting the syndrome values; and
when the syndrome values do not equal zero, determining that the received BCH encoded signal includes errors.

16. The apparatus of claim 15, wherein the memory further comprises operational instructions that cause the processing module to generate the syndrome values by:
dividing a polynomial representation of the received BCH encoded signal by a generator polynomial to produce a quotient polynomial and a remainder polynomial; and
utilizing a primitive element of the BCH code block to produce the syndrome values.

17. The apparatus of claim 14, wherein the memory further comprises operational instructions that cause the processing module to determine the number of errors of the received BCH encoded signal by:
identifying an error polynomial from a plurality of error polynomials, wherein each of the plurality of error polynomials in combination with a transmitted BCH encoded signal produce the received BCH encoded signal, wherein the transmitted BCH encoded signal that provided is in accordance with a BCH code block;
determining a degree of the error polynomial; and
corresponding the number of errors to the degree of the error polynomial.

18. The apparatus of claim 17, wherein the memory further comprises operational instructions that cause the processing module to identify the bit locations of the received BCH encoded signal having error by:
identifying the non-zero roots of the error polynomial; and
corresponding the non-zero roots to the bit locations of the received BCH encoded signal having the error.

19. The apparatus of claim 18, wherein the memory further comprises operational instructions that cause the processing module to identify the non-zero roots of the error polynomial by:
performing a Chien search algorithm.

20. The apparatus of claim 19, wherein the memory further comprises operational instructions that cause the processing module to cease the identifying of the bit locations of the received BCH encoded signal having the error by:
ceasing performing the Chien search algorithm when the Chien search algorithm has identified the number of non-zero roots of the error polynomial equal to the degree of the error polynomial.

21. An apparatus for decoding a received Bose-Chadhuri-Hocquenghem (BCH) encoded signal, the apparatus comprises:
processing module; and
memory operably coupled to the processing module, wherein the memory stores operational instructions that cause the processing module to:
when the received BCH encoded signal includes error:
determine an error signal of the received BCH encoded signal, wherein the received BCH encoded signal corresponds to a transmitted BCH encoded signal plus the error signal;
determine number of errors of the received BCH encoded signal based on the error signal;
sequentially determine bit location of errors in the BCH encoded signal based on the error signal;
when the number of determined bit locations of error in the BCH encoded signal equals the number of errors of the received BCH encoded signal, cease the sequentially determining of the bit location of the errors; and
correct the received BCH encoded signal based on the determined bit locations.

22. The apparatus of claim 21, wherein the memory further comprises operational instructions that cause the processing module to:

when the number of determined bit locations of error in the BCH encoded signal equals the number of errors of the received BCH encoded signal, determine whether the sequentially determining bit locations of the errors has been exhausted by exceeding a number of correctable bits; and when the determining whether the sequentially determining bit locations of the errors has been exhausted, determine that the received BCH encoded signal includes too many errors for accurate decoding.

23. The apparatus of claim 21, wherein the memory further comprises operational instructions that cause the processing module to determine the error signal by:

identifying an error polynomial from a plurality of error polynomials as the error signal, wherein each of the plurality of error polynomials in combination with the transmitted BCH encoded signal produce the received BCH encoded signal;

determining a degree of the error polynomial; and corresponding the number of errors to the degree of the error polynomial.

24. The apparatus of claim 23, wherein the memory further comprises operational instructions that cause the processing module to sequentially determine the bit location of errors in the BCH encoded signal by:

identifying the non-zero roots of the error polynomial; and corresponding the non-zero roots to the bit locations of the received BCH encoded signal.

25. The apparatus of claim 24, wherein the memory further comprises operational instructions that cause the processing module to identify the non-zero roots of the error polynomial by:

performing a Chien search algorithm.

26. The apparatus of claim 25, wherein the memory further comprises operational instructions that cause the processing module to cease the sequentially determining of the bit location of the errors by:

ceasing performing the Chien search algorithm when the Chien search algorithm has identified the number of non-zero roots of the error polynomial equal to the degree of the error polynomial.

* * * * *

UNITED STATES PATENT AND TRADEMARK OFFICE
CERTIFICATE OF CORRECTION

PATENT NO. : 7,206,992 B2 Page 1 of 1
APPLICATION NO. : 10/704834
DATED : April 17, 2007
INVENTOR(S) : Weizhuang (Wayne) Xin It is certified that error appears in the above-identified patent and that said Letters Patent is hereby corrected as shown below:

Column 1, line 4, insert the following:

CROSS REFERENCE TO RELATED APPLICATIONS

The present U.S. Utility Patent Application claims priority pursuant to 35 U.S.C. § 119 (e) to the following U.S. Provisional Patent Application which is hereby incorporated herein by reference in its entirety and made part of the present U.S. Utility Patent Application for all purposes:

1. U.S. Provisional Application Serial No. 60/451,803, entitled "Decoding a Received BCH Encoded Signal" (Attorney Docket No. BP2460), filed March 4, 2003, now expired.

Signed and Sealed this

Fifth Day of August, 2008

JON W. DUDAS
*Director of the United States Patent and Trademark Office*